(12) United States Patent
Park

(10) Patent No.: US 7,255,937 B2
(45) Date of Patent: Aug. 14, 2007

(54) ENCAPSULATED ORGANIC ELECTROLUMINESCENT DISPLAY

(75) Inventor: Jin-Woo Park, Yongin-si (KR)

(73) Assignee: Samsung SDI Co., Ltd., Suwon-si, Gyeonggi-do (KR)

( * ) Notice: Subject to any disclaimer, the term of this patent is extended or adjusted under 35 U.S.C. 154(b) by 303 days.

(21) Appl. No.: 10/871,571

(22) Filed: Jun. 21, 2004

(65) Prior Publication Data

US 2005/0014022 A1  Jan. 20, 2005

(30) Foreign Application Priority Data

Jul. 19, 2003  (KR) .................. 10-2003-0049544

(51) Int. Cl.
*H01L 51/50* (2006.01)
(52) U.S. Cl. .............. 428/690; 428/917; 313/304; 313/512
(58) Field of Classification Search ........... 428/690, 428/917; 313/504, 512, 506
See application file for complete search history.

(56) References Cited

U.S. PATENT DOCUMENTS

| | | | |
|---|---|---|---|
| 5,189,405 A * | 2/1993 | Yamashita et al. | 313/512 |
| 5,811,177 A * | 9/1998 | Shi et al. | 428/209 |
| 6,268,071 B1 * | 7/2001 | Yasukawa et al. | 428/690 |
| 6,617,052 B2 * | 9/2003 | Morii | 428/690 |
| 6,724,143 B2 * | 4/2004 | Chen et al. | 313/512 |
| 6,798,132 B2 * | 9/2004 | Satake | 313/495 |
| 6,872,473 B2 * | 3/2005 | Song et al. | 428/690 |
| 7,011,562 B2 * | 3/2006 | Kim et al. | 445/25 |
| 2004/0046501 A1 * | 3/2004 | Hayashi | 313/512 |

FOREIGN PATENT DOCUMENTS

| | | | |
|---|---|---|---|
| JP | 2001-126862 A | * | 5/2001 |
| JP | 2003-317934 A | * | 11/2003 |
| KR | P1999-0081659 | | 11/1999 |
| KR | 1020000009716 A | | 2/2000 |

OTHER PUBLICATIONS

Korean Office Action issued by the Korean Patent Office in applicant's corresponding Korean Patent Application No. KR 10-2003-0049544, issued on Jun. 24, 2005.

* cited by examiner

*Primary Examiner*—Dawn L. Garrett
(74) *Attorney, Agent, or Firm*—Robert E. Bushnell, Esq.

(57) ABSTRACT

A structure for an organic electroluminescent display. The organic electroluminescent display includes a substrate, an organic light-emitting unit including a first electrode, an organic layer, and a second electrode sequentially stacked on a surface of the substrate, an encapsulation cover made of inexpensive glass bonded to the substrate by a sealant to seal a space containing the organic light-emitting unit, an absorbent disposed on an inside of the encapsulation cover to absorb moisture in the space, and a buffer layer formed between the sealant and the encapsulation cover to increase the degree of curing of the sealant and the adhesion between the substrate and the encapsulation cover. Therefore, damage to the organic layer by moisture present in the space defined between the substrate and the encapsulation cover is prevented, thereby increasing the life span of the display.

19 Claims, 2 Drawing Sheets

ENCAPSULATED ORGANIC ELECTROLUMINESCENT DISPLAY

CLAIM OF PRIORITY

This application makes reference to, incorporates the same herein, and claims all benefits accruing under 35 U.S.C. §119 from an application for ORGANIC ELECTROLUMINESCENT DISPLAY earlier filed in the Korean Intellectual Property Office on Jul. 19, 2003 and there duly assigned Serial No. 2003-49544.

BACKGROUND OF THE INVENTION

1. Field of the Invention

The present invention relates to an organic electroluminescent display, and more particularly to an organic electroluminescent display with an improved encapsulation structure.

2. Description of the Related Art

Generally, organic electroluminescent displays are self emission displays that emit light by electrically exciting a fluorescent organic compound. Organic electroluminescent displays can be advantageous over liquid crystal displays (LCDs) because organic electroluminescent displays require low driving voltage, easy thin film formation, provide wide viewing angle, and have fast response speed. Therefore, there has been an increasing interest in organic electroluminescent displays as the next generation of displays.

The organic electroluminescent displays include a substrate and an organic light-emitting unit having a sequentially stacked structure of a first electrode, an organic film, and a second electrode on the substrate. The organic electroluminescent displays may include an encapsulation cover bonded to the substrate to seal a space containing the organic light-emitting unit.

In such organic electroluminescent displays, when positive and negative voltages are applied to these electrodes, holes from the positive voltage-applied electrode migrate toward the light-emitting layer of the organic film via a hole transport layer and electrons from the negative voltage-applied electrode are injected into the light-emitting layer via an electron transport layer. At this time, the electrons and the holes recombine with each other in the light-emitting layer to generate an exciton. When the exciton is changed from an excited state to a ground state, a fluorescent molecule of the light-emitting layer emits light, thereby displaying an image.

However, such organic electroluminescent displays last only so long because the organic film is very susceptible to moisture and oxygen. That is, moisture and oxygen decrease the life span of the organic film as well as deteriorate the characteristics of the organic film. In this regard, it is necessary to prevent moisture and oxygen from ever coming into contact with the organic film. Therefore, what is needed is a design for an organic electroluminescent display that better prevents moisture and oxygen from ever contacting the organic layer.

SUMMARY OF THE INVENTION

It is therefore an object of the present invention to provide an improved structure for an organic electroluminescent display.

It is also an object of the present invention to provide a design for an organic electroluminescent display that is both inexpensive to make while effectively prevents moisture and/or oxygen from ever entering and contacting the organic layer in the organic electroluminescent display.

It is also an object of the present invention to provide a design for an organic electroluminescent display where the organic layer is encapsulated and sealed off from the environment.

It is further an object of the present invention to provide a design for an electroluminescent display where the quality of the sealant used for encapsulation is not compromised by the encapsulating material.

It is still an object of the present invention to provide an electroluminescent display that lasts a long time and produces images of high quality a very long time.

These and other objects may be achieved by an encapsulated organic electroluminescent display having a buffer layer between the sealant and the encapsulating cover. The sealant buffer layer prevents the sealant from coming into contact with the encapsulation cover thus preventing $Na^+$ ions from leaving a sodalime glass encapsulation cover and migrating into the sealant and thereby degrading the curing and adhesion properties of the sealant. Therefore, even when the encapsulation cover is made of the inexpensive sodalime glass, the migration of $Na^+$ ions into the sealant is prevented, and thus the adhesion and the degree of curing of the sealant can be sufficiently ensured.

Other variations of the present invention include the presence of a buffer layer of the buffer material on an outside side of the encapsulation cover. Another variation includes the presence of the buffer layer formed with a receiving case and on an inside side of the encapsulation cover adjacent to the absorbent. These buffer layers and buffer materials can be made of $SiO_2$, $Si_3N_4$, solgel silica, organically modified ceramics (ORMOCER) or benzocyclobutene (BCB). The buffer layers may be applied by spin coating or dip coating the encapsulating material into the buffer material.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
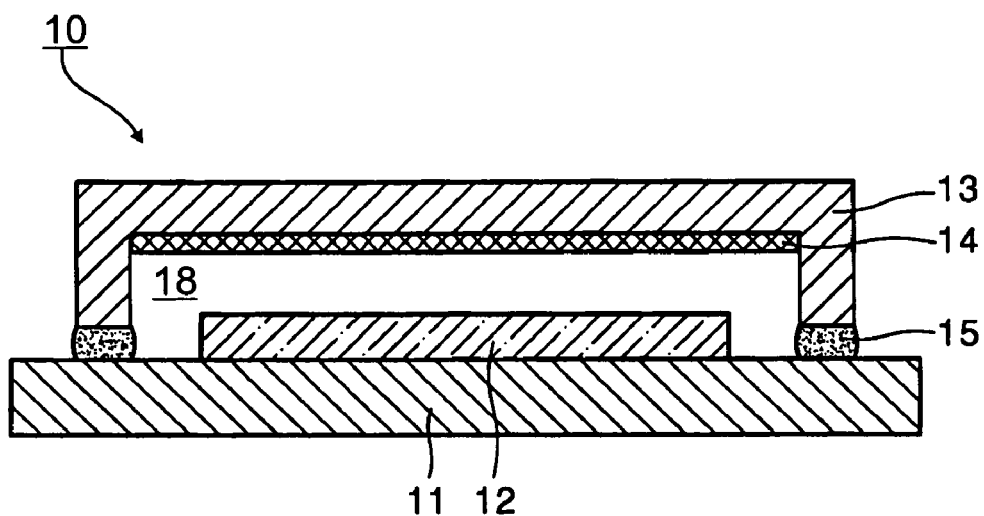
FIG. 1 is a sectional view of an organic electroluminescent display.

As an example of an encapsulated organic electroluminescent display, FIG. 1 illustrates one such display found in U.S. Pat. No. 5,882,761 to Kawami et al. Referring to FIG. 1, organic electroluminescent display 10 includes a substrate 11 bound to an encapsulation cover 13 using sealant 15. Inside the encapsulation is a space 18, stacked structure 12 and an absorbent layer 14 opposite the stacked structure 12.

The absorbent 14 is disposed on the inside of an encapsulation cover 13. In the display structure 10, the absorbent 14 disposed in space 18 between the encapsulation cover 13 and the substrate 11 can absorb any moisture that happens to get into space 18 through sealant 15. Generally, the amount of moisture and oxygen that pass through the sealant 15 varies depending on the adhesion of the sealant 15 to the substrate 11 and to the encapsulation cover 13 as well as the degree of curing of the sealant 15.

The adhesion and the degree of curing of the sealant 15 can be influenced by a material that makes up the encapsulation cover 13. Generally, the encapsulation cover 13 is either made of a sodalime glass or an alkaline-free glass. When sodalime glass is used for the encapsulation cover 13 and when the encapsulation cover is bound directly to the substrate 11 via sealant 15, $Na^+$ ions from the sodalime glass migrate into the sealant 15 and cause the adhesion properties of the sealant 15 to deteriorate and cause the sealant 15 not to cure as well compared to when no $Na^+$ ions are present. This deterioration of the adhesive and curing properties of the sealant allows more moisture and oxygen to enter into interior space 18 and to come into contact with the organic layer in the stacked structure 12 thus limiting the length of the life of the display.

One solution to the above problem is to make the encapsulation cover 13 out of a different material than sodalime glass so that the sealant 15 is not exposed to the $Na^+$ ions. For example, the encapsulation cover 13 can instead be made of an alkaline-free glass so that the adhesive and curing properties of the sealant 15 are not reduced by the $Na^+$ ions. However, it is much more expensive to use alkaline-free glass instead of sodalime glass for the encapsulation cover 13 because the cost of the material for the alkaline-free glass is very high. For this reason, it is undesirable to use alkaline-free glass in an encapsulation cover 13 for an organic electroluminescent display. Therefore, what is needed is a design for an encapsulated organic electroluminescent display that is both inexpensive to make and where the sealant used has good adhesive and curing properties so that moisture and oxygen are kept out of the internal space throughout the life of the display.

Figure 2:
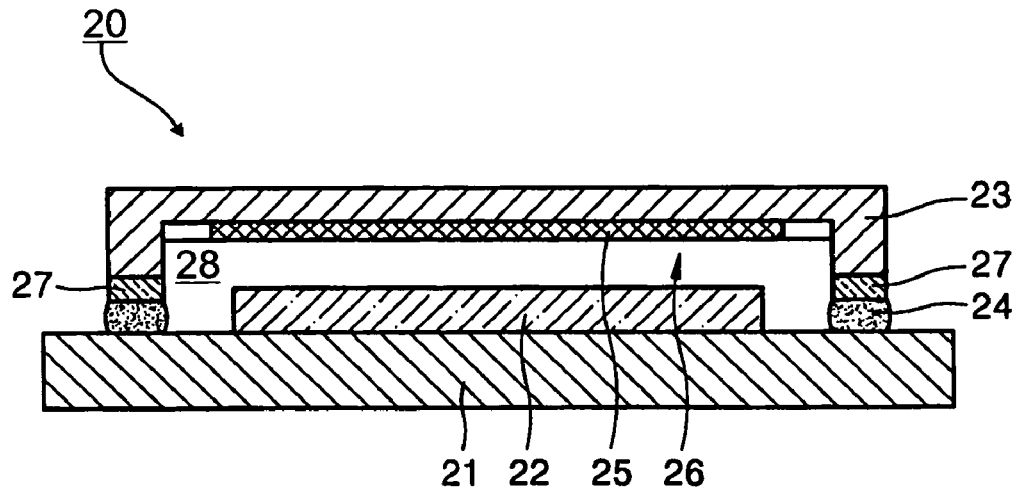
FIG. 2 is a sectional view of an organic electroluminescent display according to a first embodiment of the present invention.

Turning now to FIG. 2, FIG. 2 illustrates an organic electroluminescent display 20 according to a first embodiment of the present invention. Display 20 of FIG. 2 includes a substrate 21, an organic light-emitting unit 22 formed on a surface of the substrate 21, and an encapsulation cover 23 disposed above the organic light-emitting unit 22 and bonded to the substrate 21. The substrate 21 may be a glass substrate or a transparent insulating substrate.

The organic light-emitting unit 22 is encapsulated and sealed from the external elements by bonding the substrate 21 to the encapsulation cover 23. Organic light emitting unit 22 includes a first electrode attached to the substrate 21, a second electrode, and an organic layer that is a light-emitting layer sandwiched between the first and the second electrode. Alternatively, the organic light-emitting unit 22 can be a five-layered structure including a hole supplying layer and an electron supplying layer. The first electrode, the organic layer, and the second electrode may be formed by deposition. Here, the first electrode may be an anode and the second electrode may be a cathode or vice versa.

In a case where the first electrode is a transparent electrode and the second electrode is a reflective electrode, rear emission is carried out through an optically transparent substrate 21. On the other hand, in a case where the first electrode is a reflective electrode and the second electrode is a transparent electrode, front emission is carried out through optically transmissive encapsulation cover 23. The first electrode is disposed adjacent to the substrate 21 and the second electrode faces the encapsulation cover 23.

Often, the surface of the second electrode that faces the encapsulation cover 23 is not flat. Therefore, a protective film made of an inorganic material can be added to this surface of the second electrode to both protect the organic light-emitting unit 22 and to flatten the surface of the organic light-emitting unit 22 that faces encapsulation cover 23. This protective film may also provide heat resistance, chemical resistance, and moisture resistance to the organic light-emitting unit 22. The protective film may be made of metal oxide or metal nitride.

A space 28 is defined between the substrate 21 and the encapsulation cover 23. As illustrated in FIG. 2, when the encapsulation cover 23 is attached to the substrate 21, the recess 26 formed in the encapsulation cover 23 forms the space 28 between the substrate 21 and the encapsulation cover 23 bonded to the substrate 21. Space 28 may be a vacuum. Alternatively, the space 28 may be filled with an inert gas such as neon and argon or instead filled with a liquid having the same function as the inert gas. In any case, space 28 must not be filled with a substance that could react with the organic material or cause the organic material to deteriorate. This is why an inert gas is preferred.

The substrate 21 and the encapsulation cover 23 may be bonded to each other by a common sealant 24. That is, the sealant 24 is formed between the substrate 21 and the encapsulation cover 23 along the edges of the encapsulation cover 23. At this time, when ultraviolet light, visible light, or heat is applied, the substrate 21 and the encapsulation cover 23 are bonded together by the curing of the sealant 24. Therefore, the space 28 containing the organic light-emitting unit 22 is primarily sealed away from external elements like moisture and oxygen.

Meanwhile, preferably, the encapsulation cover 23 facing the substrate 21 is made of a sodalime glass. The encapsulation cover 23 has an absorbent layer 25 on the inside thereof. The absorbent layer 25 is made of a common material for moisture absorption.

In order to dispose the absorbent layer 25 on the inside of the encapsulation cover 23, the encapsulation cover 23 has a recess 26 formed in one side of the encapsulation cover 23. Encapsulation cover 23 is a cut layer of sodalime glass with a recess formed on one side. Absorbent layer 25 is disposed at a bottom of recess 26 of the encapsulation cover 23. The recess 26 is of groove type (or right-angled concave type) and maybe formed by etching, preferably by a completely anisotropic etch to get the square or right-angled profile in the encapsulation cover 23 instead of a curved profile. This invention is in no way limited to anisotropic etching in forming the recess, a right-angled recess and/or use of sodalime glass as an encapsulation cover.

If a powder type material is used for the absorbent layer 25, the bottom of the recess 26 is covered with a mesh member (not illustrated) so that the powder does not fall out or become detached from the encapsulation cover 23. If the absorbent layer 25 is a film, the film may be adhered the bottom of the recess 26 by means of an adhesive or, instead, the film 25 may be directly adhered to a bottom of the recess 26 of the encapsulation cover 23.

According to this first embodiment of the present invention, the display 20 includes a buffer layer 27 formed on an edge of the encapsulation cover 23. When sealant 24 is applied to seal together the encapsulation cover 23 to the substrate 21, the sealant 24 contacts the buffer layer 27 and does not contact the encapsulation cover 23. The buffer layer 27 serves to prevent Na⁺ ions from sodalime glass of the encapsulation cover 23 from migrating into the sealant 24 and degrading the adhesive and curing properties of the sealant 24. Preferably, the buffer layer 27 is made out of $SiO_2$, $Si_3N_4$, solgel silica, organically modified ceramics (ORMOCER) or benzocyclobutene (BCB). With the inclusion of the buffer layer 27, the encapsulation cover 23 can be made out of relatively inexpensive sodalime glass at the same time that the sealant 24 is not degraded by the Na⁺ ions from the encapsulation cover 23 because of the presence of the intervening buffer layer 27.

A method for making display 20 according to the first embodiment of the present invention is as follows. First, a material that makes the buffer layer 27 is spin coated onto one side of a piece of the encapsulating glass, which is preferably a sodalime glass. Spin coating, unlike dipping, coats the sodalime glass on one side only with the buffer layer 27 instead of coating the sodalime glass on both sides with the buffer layer 27. After the spin coating, the side of the sodalime glass coated with the buffer layer 27 is etched, preferably with a completely anisotropic etch to form a right-angled recess 26 on the spin-coated side of the sodalime glass. This leaves buffer layer 27 on only an edge portion of one side of the encapsulation cover 23 as is illustrated in FIG. 2. The sodalime glass having the recess and the buffer layer is then cut to form the encapsulation cover 23.

Then, the encapsulation cover 23 having the buffer layer 27 and a recess 26 (etched out portion) is bonded to the substrate 21 using sealant 24 after the organic light-emitting unit 22 is first formed on the substrate 21. Sealant 24 is used in this bonding process. The etched out (or recess side) side of the encapsulation cover 23 faces the substrate 21 with the organic light-emitting unit 22 thereon as illustrated in FIG. 2. Buffer layer 27 on the edges of the etched side of the encapsulation cover 23 prevents the encapsulation cover 23 made out of sodalime glass from coming into direct contact with the sealant 24, preventing the sodium ions from migrating from the sodalime glass to the sealant 24 thereby preserving the integrity of the curing and the adhesive properties of the sealant 24. In this case, while the buffer layer 27 is disposed between the sealant 24 and the encapsulation cover 23, the recessed side of the encapsulation cover 23 faces the substrate containing the organic light-emitting unit 22 thereon. The presence of the buffer layer 27 increases the degree of curing and the adhesion of the sealant 24, thereby minimizing the amount of moisture that passes through the sealant 24 during the life of the display 20. Furthermore, the absorbent layer 25 disposed in the recess 26 of the encapsulation cover 23 can sufficiently remove moisture that should happen to enter space 28 during the length of the life of the display 20. Therefore, damage to the organic layer in the organic light-emitting unit 22 by moisture can be prevented, thereby increasing the length of the life of the display 20.

Figure 3:
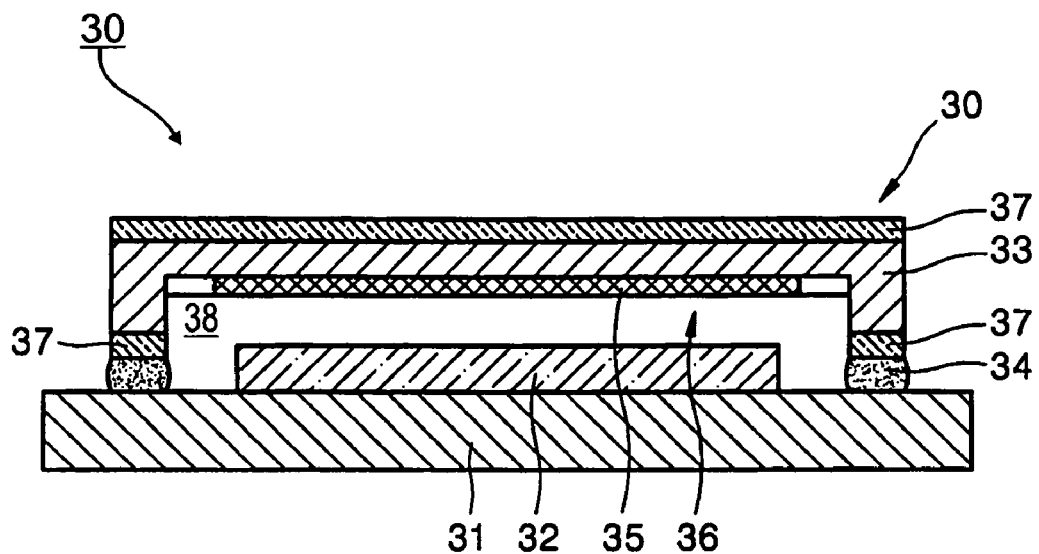
FIG. 3 is a sectional view of an organic electroluminescent display according to a second embodiment of the present invention.

Turning now to FIG. 3, FIG. 3 illustrates an organic electroluminescent display 30 according to a second embodiment of the present invention. Unlike display 20 of the first embodiment, the recess 36 in this second embodiment is formed prior to as opposed to after the application of the buffer layer 37 to the encapsulating glass. Also, unlike the first embodiment, the buffer layer 37 of the second embodiment is formed on both sides of the glass as opposed to just on one side as in the first embodiment. The structural differences between this second embodiment and the first embodiment is essentially only in terms of the buffer layer 37. Only the differences between display 30 of the second embodiment and display 20 of the first embodiment will now be described with reference to FIG. 3.

Referring to FIG. 3, a buffer layer 37 of an organic electroluminescent display 30 of the second embodiment is formed on the outer surface of the encapsulation cover 33, in addition to between the lower edge of the encapsulation cover 33 and the upper surface of the sealant 34. When encapsulation cover 33 bonded to a substrate 31, encapsulation cover 33 has a recess 36 formed on one side of the encapsulation cover 33. Absorbent layer 35 is on a bottom of recess 36 of encapsulation cover 33. After display 30 is completely formed, absorbent layer 35 faces an organic light-emitting unit 32 on substrate 31.

The encapsulation cover 33 provided with the buffer layer 37 and the recess 36 may be formed as follows. First, a glass that makes the encapsulation cover 33 is dip coated into a material that makes the buffer layer 37 to form the buffer layer 37 on both side of surfaces of the glass. Then, one side of the dip coated sodalime glass is etched, preferably via a completely anisotropic etch, to form a recess 36 in the sodalime glass. This etching process, in addition to forming recess 36, removes a portion of the buffer layer 37 on one side of the sodalime glass. Then the glass is cut to a predetermined size, resulting in encapsulation cover 33 with recess 36 and buffer layer 37. The buffer layer 37 remains only on an outer side of the encapsulation cover 33 and at the lower edges of the etched side of the encapsulation cover 33 as illustrated in FIG. 3. Thus, buffer layer 37 is present only on the edges of the etched side of the encapsulation cover 33 after the etching step. This edge portion is where sealant 34 is later applied. The buffer layer 37 present on the recess side of the encapsulation cover 33 is formed correspondingly to the sealant 34. As in the first embodiment, the buffer layer 37 in the second embodiment may be $SiO_2$, $Si_3N_4$, solgel silica, ORMOCER or BCB.

An absorbent layer 35 is disposed in the bottom of the recess 36 of the encapsulation cover 33. Then, the encapsulation cover 33 is bonded to the substrate 31 by the sealant 34. In this case, the buffer layer 37 disposed between the sealant 34 and the encapsulation cover 33 can prevent Na⁺ ions from the encapsulation cover 33 from reaching the sealant 34 and reducing the adhesive and curing properties of the sealant 34. Recess 36 faces substrate 31 after the bonding to produce space 38 within the display. Since the sodium ions from the encapsulation cover 33 never reach sealant 34 because of the presence of the buffer layer 37, the curing and adhesive properties of the sealant are preserved thus preventing moisture from entering into space 38 during the life of the display 30. As illustrated in FIG. 3, a buffer layer 37 remains on a top side of the encapsulation cover 33.

The main structural difference between display 30 of the second embodiment and display 20 of the first embodiment is the presence of buffer layer 37 on a top side of the encapsulation cover 33. The main procedural difference between the making of display 30 of the second embodiment and the making of display 20 of the first embodiment is that the sodalime glass is dip coated so that buffer layer 37 is present on both sides of the sodalime glass in the making of display 30 of the second embodiment while sodalime glass is spin coated in the first embodiment so that buffer layer 27 is formed only on one side of the sodalime glass in the making of display 20 of the first embodiment.

Figure 4:
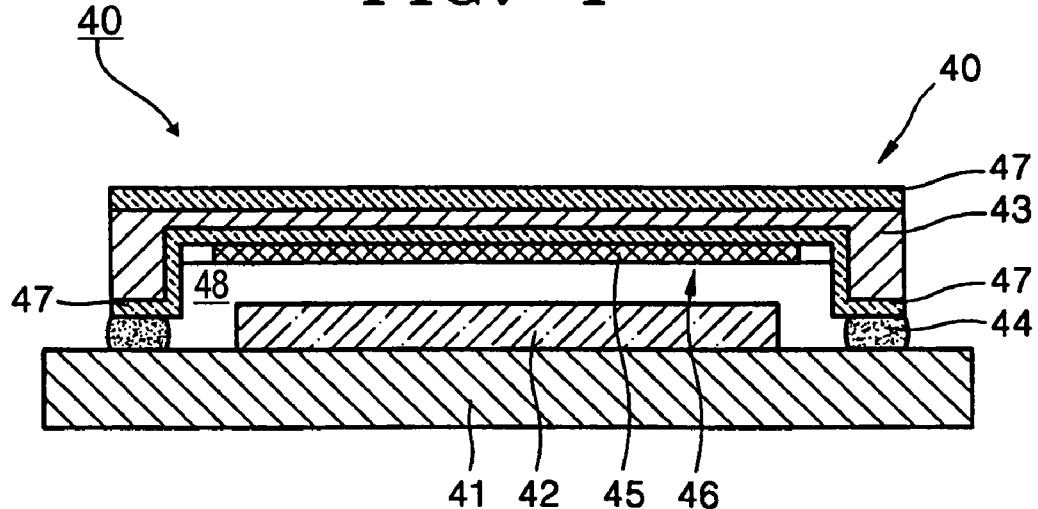
FIG. 4 is a sectional view of an organic electroluminescent display according to a third embodiment of the present invention.

Turning now to FIG. 4, FIG. 4 illustrates a display 40 according to the third embodiment of the present invention. Unlike the first and the second embodiments, the buffer layer 47 in the third embodiment remains on the entire recessed side of encapsulating cover 43 instead of only at the edge portions of the encapsulation cover 43. Referring to FIG. 4, a buffer layer 47 of an organic electroluminescent display 40 according to this third embodiment is formed between the lower edge of an encapsulation cover 43 and the upper surface of a sealant 44, on the upper surface (surface opposite the recess) of the encapsulation cover 43, and within the recess 46 of the encapsulation cover 43.

The encapsulation cover 43 provided with the buffer layer 47 and the recess 46 according to the third embodiment of the present invention may be manufactured as follows. First, a piece of sodalime glass is etched to form a recess 46. Preferably, the etching is a completely anisotropic etch so that the recess 46 has inner walls that form right angles with each other. Then, the glass having the recess 46 is dip coated with a material that makes the buffer layer 47 to form the buffer layer 47 on all surfaces of the glass. As a result, unlike the first two embodiments, the buffer layer 47 in the third embodiment is also present within the recess 46 of the glass. Then, the glass is cut to form the final encapsulation cover 43. At this state, when the glass is cut to a predetermined size, the buffer layer 47 is present on both sides of the glass, including within recess 46. Meanwhile, like the above-described embodiments, the buffer layer 47 may be made out of $SiO_2$, $Si_3N_4$, solgel silica, ORMOCER or BCB.

The buffer layer 47 present on the edges of the surface of the glass having the recess 46 is formed at a location where sealant 44 is applied. An absorbent layer 45 is disposed at a bottom of recess 46 over the buffer layer 47 that coats the bottom of the recess 46. The encapsulation cover 43 having the absorbent layer 45 formed therein faces to an organic light-emitting unit 42 and the substrate 41 when the encapsulation cover 43 is bonded to the substrate 41. Meanwhile, the buffer layer 47 can prevent the migration of $Na^+$ ions from the sodalime glass encapsulation cover 43 to the sealant 44, thereby increasing the degree of curing and the adhesion of the sealant 44.

The embodiments of the present invention seek to improve the quality of a display while keeping costs low. A low cost sodalime glass is used as the encapsulation cover. A recess is formed in the sodalime glass that becomes the internal space of the display. A buffer layer is disposed between the sodalime glass cover and the sealant so that sodium ions in the sodalime glass do not migrate into the sealant and reduce the curing and adhesion properties of the sealant. This results in a display with a longer useful life and a display of higher quality. This also results in a display that can better keep moisture from entering the display while keeping costs down.

While the present invention has been particularly shown and described with reference to exemplary embodiments thereof, it will be understood by those of ordinary skill in the art that various changes in form and details maybe made therein without departing from the spirit and scope of the present invention as defined by the following claims.

What is claimed is:

1. An organic electroluminescent display, comprising:
   a substrate;
   an organic light-emitting unit comprising a first electrode, an organic layer, and a second electrode sequentially stacked on a surface of the substrate;
   an encapsulation cover comprising sodalime glass and arranged over the substrate and over the organic light emitting unit;
   a buffer layer arranged on at least some portions of the encapsulation cover that face the substrate, said buffer layer comprising a material selected from the group consisting of $SiO_2$, $Si_3N_4$, organically modified ceramics (ORMOCER) and benzocyclobutene (BCB);
   a sealant arranged on the buffer layer and adapted to bond the buffer layer and the encapsulation cover to the substrate and to seal a space between the substrate and the encapsulation cover containing the buffer layer from an outside; and
   an absorbent material disposed on an inside of the encapsulation cover and adapted to absorb moisture in the space, the buffer layer being arranged between the sealant and the encapsulation cover, the buffer layer being adapted to prevent sodium ions from migrating from the encapsulation cover to the sealant, the encapsulation cover not being in direct contact with the sealant.

2. The organic electroluminescent display of claim 1, the buffer layer being present on a side of the encapsulation cover that faces away from the substrate.

3. The organic electroluminescent display of claim 1, the encapsulation cover comprising a recess with said absorbent material arranged at a bottom of the recess.

4. The organic electroluminescent display of claim 3, the buffer layer is further formed on a side of the encapsulation cover that faces away from the substrate as well as on a bottom of the recess facing the substrate.

5. The organic electroluminescent display of claim 4, the buffer layer being a dip coated material and comprising a material selected from the group consisting of $Si_2$, $Si_3N_4$, ORMOCER and BCB.

6. The organic electroluminescent display of claim 1, the substrate comprising a material selected from the group consisting of a glass substrate and a transparent insulating substrate.

7. The organic electroluminescent display of claim 1, further comprising a protective film comprising an inorganic material and arranged on an upper surface of the second electrode.

8. The organic electroluminescent display of claim 7, the protective film comprising a material selected from the group consisting of a metal oxide and a metal nitride.

9. The organic electroluminescent display of claim 1, the space between the substrate and the encapsulation cover being a vacuum.

10. The organic electroluminescent display of claim 1, the space between the substrate and the encapsulation cover being filled with an inert gas.

11. The organic electroluminescent display of claim 1, said encapsulation cover comprising a recess, a space within said recess being said sealed space between the encapsulation cover and the substrate.

12. The organic electroluminescent display of claim 1, the buffer layer being spin coated.

13. The organic electroluminescent display of claim 1, the buffer layer being dip coated.

14. The organic electroluminescent display of claim 12, said encapsulation cover comprising a recess, a space within said recess being said sealed space between the encapsulation cover and the substrate.

15. The organic electroluminescent display of claim 14, the buffer layer being dip coated.

16. The organic electroluminescent display of claim 1, the sealant being cured by exposure to ultraviolet light.

17. An organic electroluminescent display, comprising:
   a substrate;
   an organic light-emitting unit comprising a first electrode, an organic layer, and a second electrode sequentially stacked on a surface of the substrate;

an encapsulation cover comprising sodalime glass and arranged over the substrate and over the organic light emitting unit;

a buffer layer arranged on at least some portions of the encapsulation cover that face the substrate;

a sealant arranged on the buffer layer and adapted to bond the buffer layer and the encapsulation cover to the substrate and to seal a space between the substrate and the encapsulation cover containing the buffer layer from an outside; and an absorbent material disposed on an inside of the encapsulation cover and adapted to absorb moisture in the space, the buffer layer being arranged between the sealant and the encapsulation cover, the buffer layer being adapted to prevent sodium ions from migrating from the encapsulation cover to the sealant, the encapsulation cover not being in direct contact with the sealant, the buffer layer having a thickness that is less than that of the sealant.

18. An organic electroluminescent display, comprising:

a substrate;

an organic light-emitting unit comprising a first electrode, an organic layer, and a second electrode sequentially stacked on a surface of the substrate;

an encapsulation cover comprising sodalime glass and arranged over the substrate and over the organic light emitting unit;

a buffer layer arranged on at least some portions of the encapsulation cover that face the substrate;

a sealant arranged on the buffer layer and adapted to bond the buffer layer and the encapsulation cover to the substrate and to seal a space between the substrate and the encapsulation cover containing the buffer layer from an outside; and an absorbent material disposed on an inside of the encapsulation cover and adapted to absorb moisture in the space, the buffer layer being arranged between the sealant and the encapsulation cover, the buffer layer being adapted to prevent sodium ions from migrating from the encapsulation cover to the sealant, the encapsulation cover not being in direct contact with the sealant, the encapsulation cover comprising a roof portion and a plurality of sidewall portions extending perpendicular from the roof portion and towards the substrate, the plurality of sidewall portions being integral with the roof portion, the buffer layer being arranged only on portions of the plurality of sidewall portions that face the substrate.

19. The organic electroluminescent display of claim 18, wherein a thickness of the buffer layer is smaller than a distance that each of the plurality of sidewalls of the encapsulation cover extend from the roof portion.

* * * * *